United States Patent
Yan et al.

(10) Patent No.: US 10,217,801 B2
(45) Date of Patent: Feb. 26, 2019

(54) LIGHT-EMITTING STRUCTURE, DISPLAY DEVICE AND LIGHT SOURCE DEVICE

(71) Applicant: BOE TECHNOLOGY GROUP CO., LTD., Beijing (CN)

(72) Inventors: Guang Yan, Beijing (CN); Chang Yen Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 56 days.

(21) Appl. No.: 14/771,474

(22) PCT Filed: Nov. 14, 2014

(86) PCT No.: PCT/CN2014/091134
§ 371 (c)(1),
(2) Date: Aug. 28, 2015

(87) PCT Pub. No.: WO2016/026223
PCT Pub. Date: Feb. 25, 2016

(65) Prior Publication Data
US 2016/0293674 A1    Oct. 6, 2016

(30) Foreign Application Priority Data
Aug. 20, 2014    (CN) .......................... 2014 1 0412494

(51) Int. Cl.
*H01L 29/08* (2006.01)
*H01L 27/32* (2006.01)
(Continued)

(52) U.S. Cl.
CPC .... *H01L 27/3209* (2013.01); *G02F 1/133603* (2013.01); *H01L 27/32* (2013.01);
(Continued)

(58) Field of Classification Search
CPC ...................... H01L 27/3262; H01L 27/3209
(Continued)

(56) References Cited

U.S. PATENT DOCUMENTS

| 8,089,074 B2 | 1/2012 | Kim et al. |
| 8,994,011 B2 | 3/2015 | Kim et al. |

(Continued)

FOREIGN PATENT DOCUMENTS

| CN | 101263610 A | 9/2008 |
| CN | 101911332 A | 12/2010 |
| CN | 103168374 A | 6/2013 |

OTHER PUBLICATIONS

International Search Report of PCT/CN2014/091134 in Chinese, dated Apr. 28, 2015 with English translation.
(Continued)

*Primary Examiner* — Ajay K Arora
(74) *Attorney, Agent, or Firm* — Collard & Roe, P.C.

(57) ABSTRACT

A light-emitting structure, a display device and a light source device are disclosed; the light-emitting structure comprises a first light-emitting component (10) and a second light-emitting component (20). The first light-emitting component (10) comprises a first light-emitting layer (12) and a second light-emitting layer (14) and the second light-emitting component (20) comprises a third light-emitting layer (22). A combination of electrical connection of the first light-emitting component (10) and the second light-emitting component (14) is driven by AC current as a whole; the first light-emitting layer (12) and the second light-emitting layer (14) do not emit light at the same time; the third light-emitting layer (22) emits light at the same time either with the first light-emitting layer (12) or the second light-emitting
(Continued)

layer (14). AC drive is adopted in the light-emitting structure and is easy to achieve adjustment of color and illumination intensity.

20 Claims, 2 Drawing Sheets

(51) Int. Cl.
　　*G02F 1/1335*　　(2006.01)
　　*H01L 51/50*　　(2006.01)
　　*H01L 51/52*　　(2006.01)
　　*H05B 33/08*　　(2006.01)
(52) U.S. Cl.
　　CPC ...... *H01L 27/3202* (2013.01); *H01L 51/5016* (2013.01); *H01L 51/5036* (2013.01); *H01L 51/5088* (2013.01); *H01L 51/5092* (2013.01); *H01L 51/5096* (2013.01); *H01L 51/5206* (2013.01); *H01L 51/5225* (2013.01); *H01L 51/5234* (2013.01); *H05B 33/0809* (2013.01); *H05B 33/0896* (2013.01); *H01L 2251/301* (2013.01); *H01L 2251/305* (2013.01); *H01L 2251/306* (2013.01); *H01L 2251/308* (2013.01); *H01L 2251/558* (2013.01)
(58) Field of Classification Search
　　USPC .......................................................... 257/40
　　See application file for complete search history.

(56) References Cited

U.S. PATENT DOCUMENTS

| | | | |
|---|---|---|---|
| 2008/0116450 A1* | 5/2008 | Fong | H01L 51/5052 257/40 |
| 2008/0211400 A1 | 9/2008 | Kim et al. | |
| 2010/0283045 A1 | 11/2010 | Uchida | |
| 2011/0255185 A1* | 10/2011 | Hashi | G02B 7/08 359/824 |
| 2013/0153879 A1* | 6/2013 | Kim | H01L 27/3209 257/40 |
| 2013/0256637 A1* | 10/2013 | Seo | H01L 51/5004 257/40 |
| 2014/0291643 A1* | 10/2014 | Ogita | H01L 51/0074 257/40 |

OTHER PUBLICATIONS

Notice of Transmittal of the International Search Report of PCT/CN2014/091134 in Chinese, dated Apr. 28, 2015.
Written Opinion of the International Searching Authority of PCT/CN2014/091134 in Chinese, dated Apr. 28, 2015 with English translation.
Chinese Office Action in Chinese Application No. 201410412494.4, dated Jul. 26, 2016 with English translation.

\* cited by examiner

LIGHT-EMITTING STRUCTURE, DISPLAY DEVICE AND LIGHT SOURCE DEVICE

CROSS REFERENCE TO RELATED APPLICATIONS

This application is the National Stage of PCT/CN2014/091134 filed on Nov. 14, 2014, which claims priority under 35 U.S.C. § 119 of Chinese Application No. 201410412494.4 filed on Aug. 20, 2014, the disclosure of which is incorporated by reference.

TECHNICAL FIELD

At least one embodiment of the present invention relates to a light-emitting structure, a display device and a light source device.

BACKGROUND

Color of light emitted by a light source, such as incandescent light source and fluorescent light source, is within a certain range of light spectrum and color of a single light source is usually unable to be adjusted as desired. In some occasions, a lot of light sources will be assembled and a control unit is used to control the light-emitting intensity of the light sources to realize a color-adjustable light-emitting device. Therefore, the light-emitting device may be bulky and inapplicable, while the color produced by the light-emitting device is usually inhomogeneous in space with respect to human eyes.

A light source with adjustable illumination intensity, that is, controllable color and/or intensity, is also expected in various of illumination applications including a surface illumination light source or a back illumination light source used in a display device in the display field.

Therefore, designing a light-emitting device with adjustable color and/or intensity is the technical problem to be solved.

SUMMARY

A light-emitting structure, a display device and a light source device is provided in at least one of the embodiments of the present invention. The light-emitting structure is driven by an AC power supply, which is easy to achieve adjustment of color and illumination intensity.

A light-emitting structure is provided in at least one of the embodiments of the present invention. The light-emitting structure includes a first light-emitting component and a second light-emitting component that are electrically connected. The first light-emitting component includes a first light-emitting layer and a second light-emitting layer. The second light-emitting component includes a third light-emitting layer. A combination by electrical connection of the first light-emitting component and the second light-emitting component is driven by alternate current (AC) as a whole. The first light-emitting layer does not emit light at the same time as the second light-emitting layer. The third light-emitting layer will emit light at the same time as either the first light-emitting layer or the second light-emitting layer.

A light source device is provided in at least one of the embodiments of the present invention, including a plurality of light-emitting structures adopting the light-emitting structure mentioned above.

A display device is provided in at least one of the embodiments of the present invention, including the light source device mentioned above or a plurality of pixel structure and a drive circuit connected to the pixel structure with the pixel structure comprising the light-emitting structure mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE NUMBERS

Figure 1:
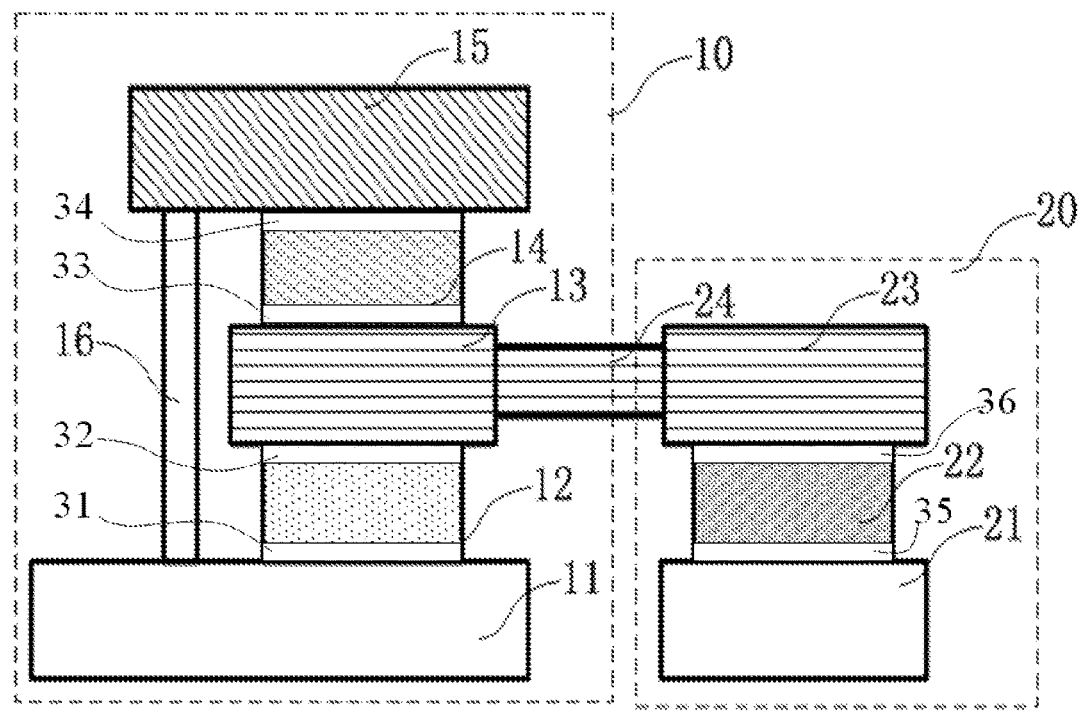
FIG. 1 is a schematic view of structure of the light-emitting structure of a first embodiment of the present invention.

10—first light-emitting component, 11—first electrode, 12—first light-emitting layer, 13—intermediate electrode, 14—second light-emitting component, 15—second electrode, 16—first connection electrode, 20—second light-emitting component, 21—third electrode, 22—third light-emitting layer, 23—fourth electrode, 24—second connection electrode.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The inventors of the present application have noted that an organic light-emitting diode (OLED) of a new type is proposed with the development of science and technology, this organic light-emitting diode has advantages such as self-Illumination, wide view, quick response, high light-emitting efficiency, low working voltage, simple fabrication, low cost and so on, and is expected to be applied in wider areas. However, the illumination intensity of the organic light-emitting diode is not easy to be adjusted. The reason is that the organic light-emitting diode is commonly driven by direct current (DC). The basic working principle is as below: electrons are input from a cathode and holes are input from an anode under electric field, and then the input electrons and the holes transmit in the light-emitting layer and recombine with each other to emit photons.

Characteristics of an organic light-emitting diode are the same as a diode, and involve unidirectional conduction, that is, forward conduction and backward non-conduction. The characteristics of an OLED relate to a plurality of factors, and the structure and the drive mode of an OLED are thought to be the primary factors in improving its stability. The technical concept of the present application is to adopt a proper structure and a drive mode (for example, AC drive) in the light-emitting structure in the embodiments of the present invention to accord an OLED with unique properties such as color adjustable or make some property (for example, service life of the OLED) of OLED improved.

First Embodiment

A light-emitting structure is provided in the embodiment. As illustrated in FIG. 1, the light-emitting structure comprises a first light-emitting component 10 and a second light-emitting component 20 that are electrically connected. The first light-emitting component 10 includes a first light-emitting layer 12 and a second light-emitting layer 14. The second light-emitting component 20 includes a third light-emitting layer 22. The assembly formed by electrical connection of the first light-emitting component 10 and the second light-emitting component 20 as a whole is driven by alternate current (AC). The first light-emitting layer 12 will not emit light at the same time as the second light-emitting layer 14. The third light-emitting layer 22 will emit light at the same time as either the first light-emitting layer 12 or the second light-emitting layer 14.

In the light-emitting structure, the first light-emitting component 10 is a laminate organic light-emitting diode which comprises more than one light-emitting layer. The second light-emitting component 20 is bipolar organic light-emitting diode which may emit light through diving of bi-direction current. In an example, the first light-emitting component 10 includes a first electrode 11, an intermediate electrode 13 and a second electrode 15. The first light-emitting layer 12 is between the first electrode 11 and the intermediate electrode 13. The second light-emitting layer 14 is provided between the intermediate electrode 13 and the second electrode 15. The first electrode 11 is connected to the second electrode 15. The second light-emitting component 20 includes a third electrode 21 and a fourth electrode 23. The third light-emitting layer 22 is provided between the third electrode 21 and the fourth electrode 23. The intermediate electrode 13 is connected to the fourth electrode 23. In addition, in an example, the first electrode 11 is connected to the second electrode 15 via a first connection electrode 16, and the intermediate electrode 13 is connected to the fourth electrode 23 via a second connection electrode 24. Such a connection configuration can guarantee that any light-emitting layer of the first light-emitting component 10 with laminated light-emitting structure can emit light only in a half period and the second light-emitting structure 20 with a single-layered light-emitting structure will emit light at any moment in the whole period. Therefore, the embodiment is not only adaptable to AC drive, but may also make color or illumination intensity of the light-emitting structure adjustable and allow the service life of the light-emitting structure to be prolonged.

The first electrode 11 and the second electrode 15 are formed on different layers with an insulation layer disposed therebetween. In preparation of the light-emitting structure, it is only necessary to form a though hole in the insulation layer which is between the first electrode 11 and the second electrode 15, and then electrically interconnect the first electrode 11 and the second electrode 15 via the though hole to form the first connection electrode 16, whereby the first electrode 11 and the second electrode 15 are connected. The intermediate electrode 13 is formed on the same layer as the fourth electrode 23. It is only necessary to maintain the connection of the patterns of the intermediate electrode 13 and the fourth electrode 23 to form the second connection electrode 24 in the fabrication of the light-emitting structure, whereby the intermediate electrode 23 and the fourth electrode 23 are connected.

In at least one example, the intermediate electrode 13 is formed of a metal material including at least one of lithium (Li), magnesium (Mg), silver (Ag), aluminum (Al), aluminum-lithium (Al—Li), calcium (Ca), magnesium-indium (Mg—In) and magnesium-silver (Mg—Ag). For example, the thickness range of the intermediate electrode 13 formed of metal is from 5 nm to 500 nm.

In at least one example, the third electrode 21 or the fourth electrode 23 is transparent. The third electrode 21, the fourth electrode 23 and the second connection electrode 24 are formed of metal materials having matched work function, or formed of metal oxides having matched work function, or formed of the combination of a metal material and a metal oxide having matched work functions. For example, the metal material includes at least one of lithium (Li), magnesium (Mg), silver (Ag), aluminum (Al), aluminum-lithium (Al—Li), calcium (Ca), magnesium-indium (Mg—In) and magnesium-silver (Mg—Ag). For example, the thickness range of the third electrode 21, the fourth electrode 23 and the second connection electrode 24 formed of metal are from 5 nm to 500 nm. For example, the metal oxide includes at least one or any combination of tin indium oxide (ITO), indium zinc oxide (IZO), zinc oxide (ZnO), aluminum-doped zinc oxide (AZO), indium oxide (In2O3) or tin oxide (SnO2). Adoption of metal oxide materials having work functions at matched energy level to form the third electrode 21, the fourth electrode 23 and the second connection electrode 24 can guarantee that the second light-emitting component 20 has a normal input of different current carriers in both a positive half-period and a negative half-period in the process of AC drive, thus ensuring that the second light-emitting component 20 may both emit light in both the positive half-period and the negative half-period of the AC power supply.

In at least one example, the first electrode 11 or the second electrode 15 is transparent. The first electrode 11, the second electrode 15 and the first connection electrode 16 are formed of a metal material, or metal oxide material, or the combination of a metal material and a metal oxide material. For example, the metal material includes at least one of lithium (Li), magnesium (Mg), silver (Ag), aluminum (Al), aluminum-lithium (Al—Li), calcium (Ca), magnesium-indium (Mg—In) and magnesium-silver (Mg—Ag). For example, the metal oxide material includes at least one or a combination of tin indium oxide (ITO), indium zinc oxide (IZO), zinc oxide (ZnO), aluminum-doped zinc oxide (AZO), indium oxide (In2O3) or tin oxide (SnO2). For example, the thickness range of the first electrode 11, the second electrode 15 and the first connection electrode 16 formed of metal material are from 5 nm to 500 nm. The metal material or the metal oxide material mentioned above to form electrodes has a proper energy level which may be matched with the energy level of other electrodes in the first light-emitting component and the second light-emitting component of the light-emitting structure. The metal material or the metal oxide material belongs to commonly used material in the semiconductor field, and thus are easily available.

It should be understood that metal materials and/or metal oxide materials having matched work functions means that the difference between work functions of the metal materials and/or metal oxide materials is comparatively small, more preferable less than 0.5 ev, to achieve a better performance of the light-emitting structure. The metal oxide material may be used to prepare a transparent electrode. The metal material may be used to prepare an opaque electrode, or the metal material may be used to prepare an electrode with a relatively less thickness to make the electrode transparent. In the embodiment, the thicknesses of the first electrode to the fourth electrode, and the first connection electrode and the second connection electrode may be same or different from each other, while the thicknesses of the electrodes each in the range from 5 nm to 500 nm.

In order to achieve AC drive, the first electrode 11 is connected to an end of an AC power supply (the first electrode 11 is also connected to the second electrode 15) and the third electrode 21 is connected to the other end of the AC power supply. The first light-emitting layer 12 emits light in the positive half period or negative half period of the AC power supply and, correspondingly, the second light-emitting layer emits light in the negative half period or the positive half period of the AC power supply. The third light-emitting layer 22 emits light in both the positive half period and the negative half period of the AC power supply. Effect of color adjustment, such as realizing white color or color change, may be achieved by means of duration of vision (visual staying phenomenon) of human eyes.

In at least one example, a base material doped with a light-emitting material is used to prepare the third light-emitting layer 22 of the second light-emitting component (bipolar organic light-emitting diode) to cooperate with the AC power supply to emit light twice in one period. The base material may be a material which is able to transmit electrons, transmit holes, or transmit both electrons and holes. Alternatively, the third light-emitting layer 22 may be formed of a light-emitting material having the capability of transmitting both electrons and holes. The third light-emitting layer 22 formed of the material mentioned above can guarantee normal input of different current carriers into the light-emitting layer in the positive half period and negative half period in the process of AC driving, thus ensuring that the second light-emitting component 20 can emit light in both the positive half period and the negative half period.

In order to make the first light-emitting component 10 and the second light-emitting component 20 have better light-emitting property, in one example, the first light-emitting component 10 further includes a first organic layer 31 that is between the first electrode 11 and the first light-emitting layer 12, a second organic layer 32 that is between the first light-emitting layer 12 and the intermediate electrode 13, a third organic layer 33 that is between the intermediate electrode 13 and the second light-emitting layer 14, a fourth organic layer 34 that is between the second light-emitting layer 14 and the second electrode 15. The first organic layer, the second organic layer, third organic layer and the fourth organic layer each are formed by a material which is able to transmit holes or electrons, that is to say, each organic layer mentioned above may be formed by a material which is able to transmit holes or electrons.

In an example, the second light-emitting component 20 further includes a fifth organic layer 35 which is provided between the third electrode 21 and the third light-emitting layer 22, and a sixth organic layer 36 which is provided between the third light-emitting layer 22 and the fourth electrode 23. The fifth organic layer and the sixth organic layer are formed by a material which is able to transmit holes or electrons, respectively. According to the connection of the first electrode 11 and the third electrode 21 of the light-emitting structure with the positive pole and negative pole of the AC power supply, the organic layers each may be configured to be able to transmit electrons or holes, for example, configured to be electron injection layer and hole blocking layer or hole transfer layer and electron blocking layer, which will not be specifically restricted. Adoption of the materials mentioned above to form the fifth organic layer and the sixth organic layer can effectively improve injection rate of current carriers, and guarantee that any light-emitting layer of the first light-emitting component 10 only emits light in a half-period and the second light-emitting component 20 having a structure of single light-emitting layer can emit light at any moment in a whole period.

In the above example, the material which is able to transmit holes include but not limited to aromatic diamine compounds, triphenylamine compounds, aromatic triamine compounds, biphenyl diamine compounds or triarylamine polymer. The base material which is able to transmit electrons includes metal complexes, carbazole derivatives, imidazole derivatives, phenanthroline derivatives, or anthracene derivatives. The light-emitting material includes but not limited to phosphorescent material including Ir, Pt, Ru or Cu.

In the light-emitting structure of the embodiment, the colors of light emitted by the first light-emitting layer 12, the second light-emitting layer 14 and the third light-emitting layer 22 may be different, or partially the same or all the same. For instance, in an example, the first light-emitting layer 12 is a blue light-emitting layer, the second light-emitting layer 14 is a red light-emitting layer, and the third light-emitting layer is a green light-emitting layer, and color change and white color may be achieved by applying different drive frequencies to the AC power supply. As another exemplary example, the first light-emitting layer 12 is a blue light-emitting layer, the second light-emitting layer 14 is a blue light-emitting layer, and the third light-emitting layer is a yellow light-emitting layer, and white color may be achieved by applying different drive frequencies of the AC power supply. In adjustment of illumination intensity, it is possible to make the light-emitting intensities of the third light-emitting layer 22 in the positive half-period and the negative half-period are different from each other, and/or illumination intensity of the first light-emitting layer 12 and the second light-emitting layer 14 are different in their respective light-emitting period, thus the total illumination intensity of the light-emitting structure may become different in different light-emitting periods. It is also possible to change the proportion of the positive half-period and the negative half-period in the whole light-emitting period to make the light-emitting structure have various illumination intensities. It is possible to reduce the operation frequency of the first light-emitting layer 12 and the second light-emitting layer 14 by half to increase the service life of the light-emitting structure.

It should be understood that the illumination color of the first light-emitting layer 12, the second light-emitting layer 14 or the third light-emitting layer 22 may be adjusted flexibly as required to make color or illumination intensity adjustable, which will not be specifically limited here.

Figure 2:
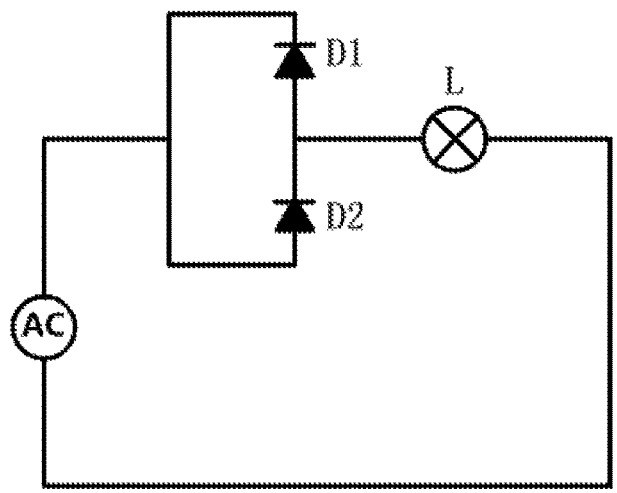
FIG. 2 is an equivalent circuit diagram of alternating current (AC) drive of the light-emitting structure in FIG. 1.

As shown in FIG. 2, the light-emitting structure is equivalent to two diodes that are connected in parallel, and the two diodes are respectively D1 and D2, in which, the negative pole of D1 and the positive pole of D2 are connected to the AC power supply, and the positive pole of D1 and the negative pole of D2 are connected to a light-emitting component L. Therefore, either D1 or D2 will be conducted in a positive half-period or a negative half-period of the AC power supply while the light-emitting component L will emit light in a whole period of the AC power supply. Thus, the light-emitting structure may be driven by the AC power supply and can emit light in both the positive half-period and the negative half-period of the AC power supply.

Figure 3:
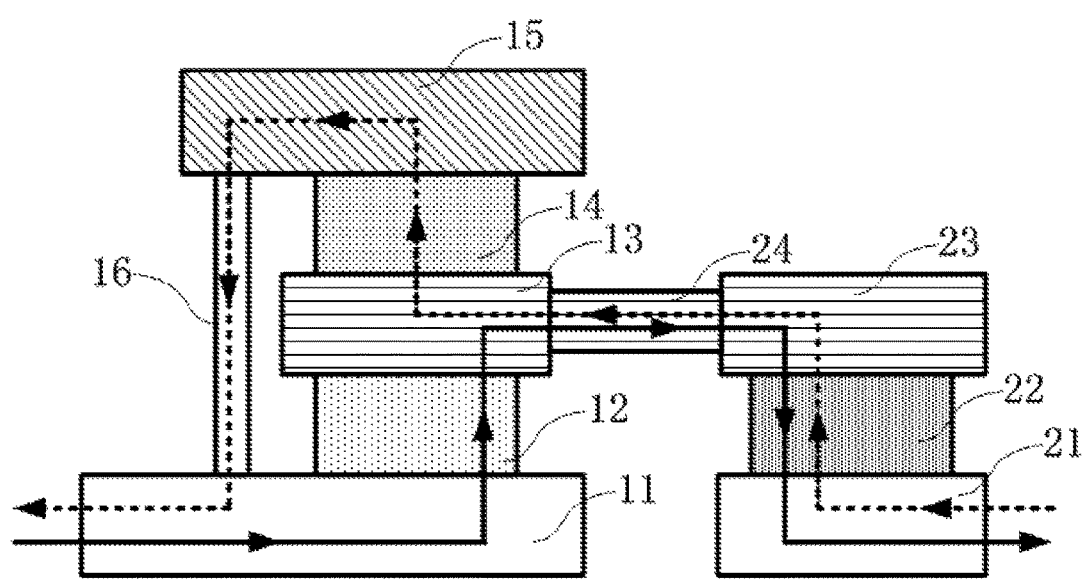
FIG. 3 is a schematic view of AC drive of the light-emitting structure in FIG. 2.

As illustrated in FIG. 3, description will be given in the following by taking the case in which the first electrode 11 is the anode of the first light-emitting component 10 for example.

In the positive half-period of AC power supply, the current direction in the light-emitting structure is as indicated by the solid line shown in FIG. 3: the current runs through the first electrode 11, the first light-emitting layer 12, the intermediate electrode 13, the second connection electrode 24, the fourth electrode 23, the third light-emitting layer 22 and the third electrode 21 in this sequence, and the color felt in human eyes will be the combination of the colors of light emitted by the first light-emitting layer 12 and the third light-emitting layer 22.

In a negative half-period of AC power supply, the current direction in the light-emitting structure is as indicated by the dashed line shown in FIG. 3: the current runs through the third electrode 21, the third light-emitting layer 22, the fourth electrode 23, the second connection electrode 24, the intermediate electrode 13, the second light-emitting layer 14, the second electrode 15, the first connection electrode 16 and the first electrode 11 in this sequence, and the color felt in human eyes will be the combination of the colors of light emitted by the second light-emitting layer 14 and the third light-emitting layer 22.

The inventor has noted in research by analyzing the performance of the light-emitting structure after applying a backward voltage that: because the first light-emitting component 10 in the light-emitting structure will emit light either in the positive half-period or the negative half-period of the AC power supply, aging of the first light-emitting component 10 is reduced and the service life of the first light-emitting component 10 is increased due to reduced operation frequencies of the first light-emitting component 10, which makes the performance of the light-emitting structure remarkably improved.

The light-emitting structure in the embodiment can be directly driven by an AC power supply to make organic light-emitting diode have unique properties (such as adjustable color or illumination intensity), or some property improved (such as service life prolonged).

Second Embodiment

A display device is provided in the embodiment, and the display device may be an organic light-emitting diode (OLED) display device. The display device includes a plurality of pixel structures and a drive circuit connected to the pixel structures. The light-emitting structure according to the first embodiment is used in each of the pixel structures. AC drive is implemented by the drive circuit to the light-emitting structure with the first light-emitting component and the second light-emitting structure being electrically connected as a whole. For example, the display device may be a liquid crystal display device which employs a light source device comprising the light-emitting structure as a backlight source of liquid crystal panel. The light source device can be referred to the following embodiments and therefore will not be specified here.

The display device may be any product or component having a display function such as electronic paper, OLED panel, cell phone, tablet computer, TV set, display, laptop computer, digital photo frame or navigator.

Colors of the light sources of the respect pixels of the display device in the embodiment may be adjusted by control of the AC power supply by means of the light-emitting structure of the first embodiment, thus the user can have better viewing experience.

Third Embodiment

A light source device is provided in the embodiment and the light source device may be applied to the display technical field. For example, the light source may be used as a backlight source of a liquid crystal panel in a liquid display device. The light source device includes a plurality of light-emitting structures, and these light-emitting structures be of the light-emitting structure of the first embodiment.

The light source device may be one of a direct-illustration type or a side-illustration type, and its position corresponding to the display panel may be configured according to actual application, which will not be limited here.

Adoption of the light source device in the embodiment as a backlight source in a liquid crystal display device may make the backlight source in the liquid crystal display device have advantages such as adjustable illumination intensity and prolonged life.

Fourth Embodiment

A light source device is provided in the embodiment and the light source device may be applied to the field of illumination, such as used as neon lamp display in the ornament display field. The light source device includes a plurality of light-emitting structures, which are of the light-emitting structure of the first embodiment.

A neon lamp is commonly made by firing a glass, and a glass tube can be bended to any shape. Glass tubes of different type are filled with different inert gas, and the inert gas can be ignited by high-voltage electric field applied by the two electrodes provided on ends of the glass tubes, thus colorful display effects can be achieved. However, environmental pollution may happen since the neon lamp contains heavy metal such as hydrargyrum and in addition, high-voltage electric field may bring potential risks. Thus, other light-emitting light sources are gradually used to realize the effect of neon lamp display with the development of technology.

In the embodiment, light-emitting structures are adopted to form a light source device. Different colors may be achieved in different light-emitting structures, or further different patterns formed by different colors may be achieved if the colors of the light-emitting layers of the light-emitting structures are set according to desired color in neon lamp display, thus achieving multi-colored neon lamp display effect and acquiring lighter and thinner neon lamp.

Following advantages can be obtained with the light source device: 1) it does not contain heavy metal such as hydrargyrum and will not pollute environment; 2) the possibility that fractures easily harm people is low because it is a solid light source; 3) it will not scald someone because it is a cold light source. In addition, each of the light-emitting structure included in the light source device is a point light source, so the point light sources are still each controllable even if constituting a linear light source or a surface light source, thus diversified illumination effect can be realized by control of each point source to obtain better illumination effect.

What are described above is related to the illustrative embodiments of the disclosure only and not limitative to the scope of the disclosure; the scopes of the disclosure are defined by the accompanying claims.

This application claims the benefit of Chinese patent application No. 201410412494.4 filed in china on Aug. 20, 2014, which is hereby incorporated by reference for all purposes as if fully set forth herein.

The invention claimed is:

1. A light-emitting structure, comprising:
a first light-emitting component and a second light-emitting component that are electrically connected, wherein,
the first light-emitting component comprises a first light-emitting layer and a second light-emitting layer, and the second light-emitting component comprises a third light-emitting layer;
a combination by electrical connection of the first light-emitting component and the second light-emitting component is driven by alternate current (AC) as a whole; the first light-emitting layer and the second light-emitting layer do not emit light at the same time;
the third light-emitting layer is configured to emit light at the same time as the first light-emitting layer and the third light-emitting layer is also configured to emit light at the same time as the second light-emitting layer;
the first light-emitting component further comprises an intermediate electrode; the second light-emitting component further comprises a fourth electrode; the intermediate electrode is connected to the fourth electrode via a second connection electrode, the intermediate electrode is in direct contact with the second connection electrode, and a center line of the second connection electrode, a center line of the intermediate electrode, and a center line of the fourth electrode are substantially on a same straight line.

2. The light-emitting structure according to claim 1, wherein,
the first light-emitting component further comprises a first electrode and a second electrode; the first light-emitting layer is provided between the first electrode and the intermediate electrode, and the second light-emitting layer is provided between the intermediate electrode and the second electrode; the first electrode is connected to the second electrode;
the second light-emitting component further comprises a third electrode; the third light-emitting layer is provided between the third electrode and the fourth electrode; the intermediate electrode is connected to the fourth electrode.

3. The light-emitting structure according to claim 2, wherein the first electrode is connected to the second electrode via a first connection electrode.

4. The light-emitting structure according to claim 3, wherein the intermediate electrode is formed of a metal material, and the metal material comprises at least one of lithium, magnesium, silver, aluminum, aluminum-lithium, calcium, magnesium-indium and magnesium-silver.

5. The light-emitting structure according to claim 3, wherein a thickness range of the intermediate electrode is from 5 nm to 500 nm.

6. The light-emitting structure according to claim 3, wherein,
the third electrode or the fourth electrode is transparent,
the third electrode, the fourth electrode and the second connection electrode are formed by metal materials having matched working functions and/or metal oxide materials having matched working functions.

7. The light-emitting structure according to claim 6, wherein the metal material comprises at least one of lithium, magnesium, silver, aluminum, aluminum-lithium, calcium, magnesium-indium and magnesium-silver.

8. The light-emitting structure according to claim 6, wherein a thickness range of the third electrode, the fourth electrode and the second connection electrode formed by the metal material is from 5 nm to 500 nm.

9. The light-emitting structure according to claim 6, wherein the metal oxide material comprises at least one or a combination of tin indium oxide, indium zinc oxide, zinc oxide, aluminum-doped zinc oxide, indium oxide or tin oxide.

10. The light-emitting structure according to claim 3, wherein,
the first electrode or the second electrode is transparent, and
the first electrode, the second electrode and the first connection electrode are formed by a metal material and/or a metal oxide material.

11. The light-emitting structure according to claim 10, wherein the metal material for forming the first electrode, the second electrode and the first connection electrode comprises at least one of lithium, magnesium, silver, aluminum, aluminum-lithium, calcium, magnesium-indium and magnesium-silver.

12. The light-emitting structure according to claim 10, wherein a thickness range of the first electrode, the second electrode and the first connection electrode formed by the metal material is from 5 nm to 500 nm.

13. The light-emitting structure according to claim 10, wherein the metal oxide material for forming the first electrode, the second electrode and the first connection electrode comprises at least one or a combination of tin indium oxide, indium zinc oxide, zinc oxide, aluminum-doped zinc oxide, indium oxide or tin oxide.

14. The light-emitting structure according to claim 2, wherein,
the first light-emitting component further comprises:
a first organic layer which is provided between the first electrode and the first light-emitting layer;
a second organic layer which is provided between the first light-emitting layer and the intermediate electrode;
a third organic layer which is provided between the intermediate electrode and the second light-emitting layer; and
a fourth organic layer which is provided between the second light-emitting layer and the second electrode;
wherein the first organic layer, the second organic layer, the third organic layer and the fourth organic layer are respectively formed of a material which is able to transmit electrons or holes.

15. The light-emitting structure according to claim 14, wherein,
the second light-emitting component further comprises:
a fifth organic layer which is provided between the third electrode and the third light-emitting layer; and
a sixth organic layer which is provided between the third light-emitting layer and the fourth electrode;
wherein the fifth organic layer and the sixth organic layer are respectively formed of a material which is able to transmit electrons or holes.

16. The light-emitting structure according to claim 2, wherein,
the first electrode is connected to an end of an AC power supply, and the third electrode is connected to another end of the AC power supply;
the first light-emitting layer emits light in a positive half period or a negative half period of the AC power supply, and the second light-emitting layer emits light in the negative half period or the positive half period of the AC power supply;
the third light-emitting layer emits light in the positive half period and the negative half period of the AC power supply.

17. The light-emitting structure according to claim 1, wherein,
the third light-emitting layer is formed by a light-emitting material which is able to transmit electrons and holes; or
the third light-emitting layer is formed by a base material doped with a light-emitting material and the base material comprises a material which is able to transmit electrons and/or electrons.

18. The light-emitting structure according to claim 1, wherein,
color of light emitted by the first light-emitting layer, the second light-emitting layer and the third light-emitting layer may be different, partially same or same.

19. A light source device, comprising a plurality of light-emitting structures, wherein,
the light-emitting structures are of the light-emitting structure according to claim 1.

20. A display device, comprising:
a plurality of pixel structures and a drive circuit connected to the pixel structures, wherein the pixel structures comprises a light-emitting structure; or
a light source device comprising a light-emitting structure,
wherein the light-emitting structure is of the light-emitting structure according to claim 1.

* * * * *